US012763140B1

(12) United States Patent
Talin et al.

(10) Patent No.: US 12,763,140 B1
(45) Date of Patent: Oct. 13, 2026

(54) NONVOLATILE ELECTROCHEMICAL RANDOM ACCESS MEMORY

(71) Applicants: National Technology & Engineering Solutions of Sandia, LLC, Albuquerque, NM (US); Regents of the University of Michigan, Ann Arbor, MI (US)

(72) Inventors: Albert Alec Talin, Dublin, CA (US); Elliot James Fuller, Livermore, CA (US); Yiyang Li, Ann Arbor, MI (US); Virgil Watkins, Ann Arbor, MI (US); Sungmin Diana Kim, Ann Arbor, MI (US); Laszlo Cline, Ann Arbor, MI (US); Jingxian Li, Ann Arbor, MI (US)

(73) Assignees: National Technology & Engineering Solutions of Sandia, LLC, Albuquerque, NM (US); The Regents of the University of Michigan, Ann Arbor, MI (US)

( * ) Notice: Subject to any disclaimer, the term of this patent is extended or adjusted under 35 U.S.C. 154(b) by 121 days.

(21) Appl. No.: 18/775,896

(22) Filed: Jul. 17, 2024

Related U.S. Application Data

(60) Provisional application No. 63/527,162, filed on Jul. 17, 2023.

(51) Int. Cl.

| | |
|---|---|
| ***G11C 13/00*** | (2006.01) |
| ***G11C 27/00*** | (2006.01) |
| ***H10B 63/00*** | (2023.01) |
| ***H10N 70/00*** | (2023.01) |
| ***H10N 70/20*** | (2023.01) |

(52) U.S. Cl.
CPC ........ *G11C 13/0007* (2013.01); *G11C 27/005* (2013.01); *H10B 63/00* (2023.02); *H10N 70/245* (2023.02); *H10N 70/253* (2023.02); *H10N 70/8833* (2023.02); *H10N 70/8836* (2023.02); *H10N 70/023* (2023.02); *H10N 70/026* (2023.02); *H10N 70/8416* (2023.02)

(58) Field of Classification Search
CPC .. G11C 13/0007; G11C 27/005; H10B 63/00; H10N 70/245; H10N 70/253; H10N 70/8833; H10N 70/8836; H10N 70/023; H10N 70/026; H10N 70/8416
See application file for complete search history.

(56) References Cited

U.S. PATENT DOCUMENTS

| | | | | |
|---|---|---|---|---|
| 11,201,284 B2 * | 12/2021 | Bishop | ................. | H10N 70/245 |
| 11,450,802 B1 | 9/2022 | Li et al. | | |
| 2018/0358553 A1 * | 12/2018 | Brew | .................. | G11C 13/0011 |
| 2021/0175421 A1 * | 6/2021 | Lin | ...................... | H10N 70/068 |
| 2022/0319588 A1 * | 10/2022 | Rozen | .................. | H10N 70/823 |
| 2023/0301211 A1 * | 9/2023 | Woo | ...................... | H10N 70/24 257/4 |

FOREIGN PATENT DOCUMENTS

WO WO-2019210156 A1 * 10/2019 ......... G11C 13/0069

* cited by examiner

*Primary Examiner* — Amir Zarabian
*Assistant Examiner* — Bradley S Coon
(74) *Attorney, Agent, or Firm* — Gregory M. Doudnikoff; Daniel J. Jenkins; Mario A. Burgarello

(57) ABSTRACT

An ECRAM cell with orders of magnitude longer retention than previously achieved is provided. This retention is achieved by choosing active channel and gate materials that exhibit phase separation, which enables the formation of multiple effectively equilibrium resistance states.

13 Claims, 7 Drawing Sheets

State 1: $X_1 = X_2$

State 2: $X_1 \neq X_2$

NONVOLATILE ELECTROCHEMICAL RANDOM ACCESS MEMORY

CROSS-REFERENCE TO RELATED APPLICATIONS

This application claims priority to U.S. Provisional Patent Application No. 63/527,162, filed on Jul. 17, 2023, entitled "NONVOLATILE ELECTROCHEMICAL RANDOM ACCESS MEMORY," the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD

The present disclosure relates to electrochemical random-access memory (ECRAM), an analog resistive memory element for in-memory computing.

BACKGROUND

In-memory computing using analog resistive nonvolatile memory is highly attractive for data-heavy workflows like artificial intelligence. By co-locating the memory and processing elements on a single device, in-memory analog computing is potentially much faster and more energy efficient than optimized digital computers. Electrochemical random-access memory (ECRAM) is a recently developed and highly promising analog resistive memory element for in-memory computing. One longstanding challenge of ECRAM is attaining retention time beyond a few hours. This short retention has precluded ECRAM from being considered for inference classification in deep neural networks, which is likely the largest opportunity for in-memory computing.

ECRAM stores analog information states by electrochemically shuttling guest dopant ions like lithium ions, protons, or oxygen vacancies between two mixed-conducting host materials. Since research in ECRAM has dramatically increased from 2017, it has met many of the requirements for analog in-memory computing, including linear & symmetric among hundreds of analog states; low read and write currents, voltages, and energies; parallel weight updates; CMOS-compatible materials with back-end-of-the-line (BEOL) thermal budgets; and scaled sub-micron sized devices. Recently, sub-microsecond switching times have been shown using protons-based into polymers, MXenes and tungsten oxides. These developments make ECRAM highly promising for on-line training, which aims to identify the correct analog resistance states (or weights) of a network using the training set of pre-classified data. However, a larger application of in-memory computing is inference, which uses a pre-trained network to classify new data. Inference is not only simpler to conduct in analog, but is more ubiquitous because all distributed devices, including ones with very limited energy budgets, would use inference to classify new data.

An overarching challenge that has precluded ECRAM from inference accelerators is insufficient retention, generally only several hours at room temperature, and much lower than the 10 years at 85° C. benchmark for ReRAM, PCM, and floating gate memory. Moreover, nearly all retention studies utilize an electronic switch that keeps the gate and channel electrodes under "open circuit;" while this switch can provide several hours of retention in larger devices >10 μm, leakage currents in the switch will preclude retention times in scaled sub-micron devices. A recent study using a 100-nm proton-based ECRAM shows only about 100 second (sec) retention time due to this scaling-retention challenge.

What is needed are ECRAM architectures that overcome one or more of these disadvantages and that provide other advantageous features. Other features and advantages will be made apparent from the present specification. The teachings disclosed extend to those embodiments that fall within the scope of the claims, regardless of whether they accomplish one or more of the aforementioned needs.

SUMMARY OF THE DISCLOSURE

The present disclosure is directed to ECRAM with orders of magnitude longer retention than previously achieved. In an embodiment, the ECRAM exceeds 10 years at about 85° C. This retention is achieved by choosing active channel and gate materials that exhibit phase separation, which enables the formation of multiple effectively equilibrium resistance states.

According to an embodiment of the disclosure, an ECRAM device is disclosed that includes a solid electrolyte having a first side and a second side; a Gate layer of a metal sub-oxide on the first side, the Gate layer having a Gate layer first side in contact with the solid electrolyte and a Gate layer second side opposite the Gate layer first side; a Channel layer of the metal sub-oxide on the second side, the Channel layer having a Channel layer first side in contact with the second side and a Channel layer second side opposite the Channel layer first side; a first current collector electrically connected to the Gate layer second side; a second current collector electrically connected the Channel layer second side; and a third current collector electrically connected to the Channel layer second side. The device configuration allows for phase separation in the Channel layer.

According to another embodiment of the disclosure, a method of forming an ECRAM cell is disclosed that includes depositing a second and third current collector onto a substrate; depositing a Channel layer of a metal sub-oxide upon the second and third current collector; depositing a solid electrolyte upon the Channel layer; depositing a Gate layer upon the solid electrolyte; and depositing a first current collector upon the Gate layer.

According to another embodiment of the disclosure, a method of operating an ECRAM cell is disclosed that includes providing an ECRAM cell; applying a voltage across the ECRAM cell to set the state of the metal sub-oxide; applying a voltage to the Channel layer; and reading the Channel layer voltage at a 100 mV to determine the state of the channel material. The ECRAM cell includes a solid electrolyte having a first side and a second side; a Gate layer of a metal sub-oxide on the first side, the Gate layer having a Gate layer first side in contact with the solid electrolyte and a Gate layer second side opposite the Gate layer first side; a Channel layer of the metal sub-oxide on the second side, the Channel layer having a Channel layer first side in contact with the second side and a Channel layer second side opposite the Channel layer first side; a first current collector electrically connected to the Gate layer second side; a second current collector electrically connected to the Channel layer second side; and a third current collector electrically connected to the Channel layer second side. The device configuration allows for phase separation in the Channel layer. The ECRAM cell configuration provides phase separation in the channel material.

BRIEF DESCRIPTION OF THE FIGURES

The application will become more fully understood from the following detailed description, taken in conjunction with the accompanying figures, wherein like reference numerals refer to like elements, in which.

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

Figure 1A:
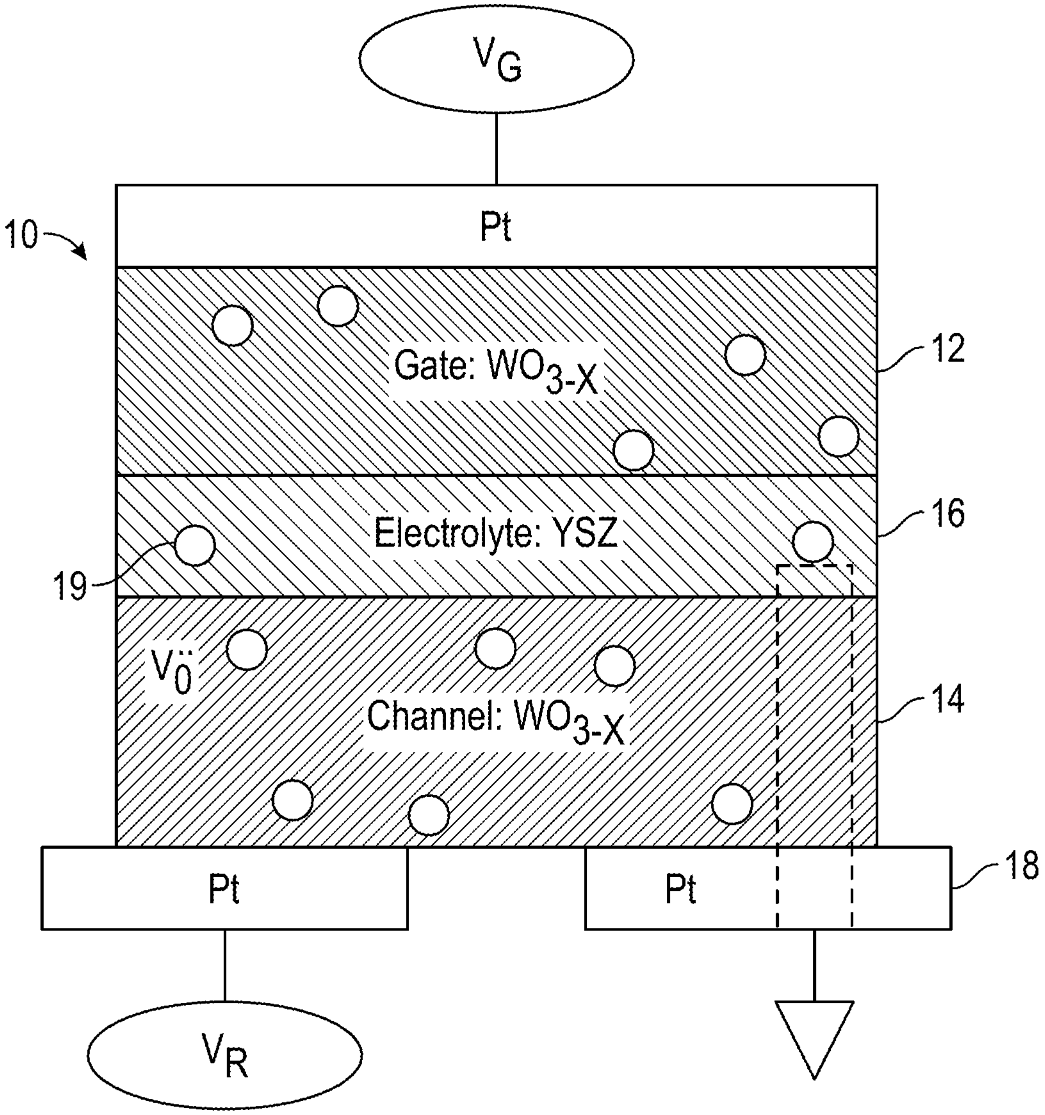
FIG. 1A illustrates a schematic and cross-section TEM of a $WO_{3-x}$ ECRAM cell according to an embodiment of the disclosure.

According to the present disclosure, a nonvolatile ECRAM with a short-circuit retention time several orders of magnitude higher than previously shown in ECRAM and can likely meet the 10 years at 85° C. benchmark for binary states is disclosed. By analyzing the electrochemical currents, while not wanting to be bound by any theory, it is hypothesized that this unprecedented retention time arises from phase separation into oxygen-rich and oxygen-poor phases of amorphous oxide materials used in the ECRAM cell. This yields nonvolatile change in the ion concentration that does not fully reverse upon applying short circuit conditions after switching. The ECRAM functions by electrochemical tuning of the channel composition when a voltage is applied between the gate and the drain. The drain is a conductor or current collector attached to the channel.

Application of negative gate voltage increases the channel average oxygen content and the relative amount of the different metal oxide phases present. Application of a positive gate voltage decreases the channel average oxygen content and changes the relative amounts of the different metal oxide phases present. For example, in the vanadium oxide system (see discussion below regarding other oxide systems), the two phases may be $V_2O_5$ and $VO_2$. Furthermore, these phases may be suboxides, such as $VO_{2-x}$, where $0<x<0.5$. By changing the overall oxygen content and the relative amounts of the phases present, we change the electronic conductance of the channel, and therefore its state. Once programmed, the gate can be grounded and the state of the ECRAM is read by applying a small voltage $V_R$ between the range of $0.05V<V_R<1V$ to the source. In an embodiment, $V_R$ may be 100 mV. This causes current to flow from drain to source that is determined by the channel conductance value. The analog conductance state is retained by having phase separation in both the channel and the gate oxides, which result with low or zero driving force for oxygen to move between the two electrodes. In an embodiment, heat may be applied during programming to accelerate both the transport of vacancies across the solid electrolyte and the phase growth and separation processes.

According to the present disclosure, tungsten, tantalum, nickel, cobalt and vanadium sub-oxides with amorphous nanocrystalline microstructures are used to build an ECRAM cell that meets the desired needs of longer retention times. These oxides display different oxygen rich and oxygen poor phases. This yields nonvolatile change in the ion concentration that is retained upon applying short circuit conditions after switching. These metal oxide channel materials achieve a non-volatile ECRAM.

In an embodiment, the ECRAM cells are formed of an amorphous metal sub-oxide ($MO_{y-x}$) grown in a vertical stack such that the channel is on the bottom, the gate (reservoir) is on top. The channel and gate are separated by a thin, 20-1000 nm solid electrolyte layer having a thickness between 20 nm and 1000 nm. Y represents the stoichiometric value for a particular metal oxide ("3" for $WO_3$) and X represents a value for missing oxygen and has a range between $0<X\leq0.5$. The metal may be selected from a group including tungsten oxide, tantalum oxide, nickel oxide, cobalt oxide and vanadium oxide. In an embodiment, the sub-oxide may be amorphous tungsten sub-oxide ($WO_{3-x}$). The sub-oxide is between 10 nm and 1000 nm thick on both sides of the substrate. In an embodiment, the sub-oxide may be between 30 and 300 nm. In an embodiment, the sub-oxide may be 140 nm thick.

The cell layers are formed by a layering deposition method, such as but not limited to reactive sputtering, atomic layer deposition (ALD), chemical vapor deposition (CVD) and solution methods such as sol-gel. In such a manner the bottom current collectors, channel, electrolyte, gate and top current collector may be layered to form the device. In an embodiment, the cell layers grown by reactive sputtering.

The solid electrolyte is an amorphous, insulative material. The solid electrolyte is an ionic conductor and an electronic insulator. In an embodiment, the electrolyte may be yttrium stabilized zirconia (YSZ), $HfO_X$ or a similar ionic conductor. The electrolyte acts as a conductor of oxygen vacancies or equivalently of oxygen ions, while preventing electronic conduction. The electrolyte has a thickness of between 10 nm and 1000 nm. In an embodiment, the substrate may have a thickness between 0.05 mm to 1 mm. In an embodiment, the substrate may have a thickness of 0.3 mm. In an embodiment, the substrate has a surface roughness of <1 nm rms.

In addition, the ECRAM includes current collectors that make electrical contact to the channel (source, drain) and to the reservoir (gate). The channel electronic conductance measured between the source and drain at low bias typically 100 mV represents the 'read' state, while programming of the ECRAM ('write') is done by applying a bias, typically of 1-5 V to the gate. The current collectors are grown onto the side of the oxide opposite the substrate layer. In an embodiment, the current collectors are grown by sputtering. In other embodiments, the current collectors may be grown by other methods such as but not limited to electron beam evaporation. In an embodiment, the current collectors may be grown by sputtering over shadow masks.

Example—Tungsten Suboxide ECRAM Devices

FIG. 1A illustrates an exemplary ECRAM cell 10 according to an embodiment of the invention. This cell stores and switches analog information states as the concentration of oxygen vacancies ions in the channel. The ECRAM cell 10 is formed of two 140 nm layers of amorphous tungsten sub-oxide (WO3-X) grown on opposite sides of a single-crystal yttria-stabilized zirconia (YSZ) substrate 16 using reactive sputtering. The two layers include a Gate layer 12 that acts as a reservoir for oxygen vacancies and a Channel layer 14 that is either reduced or oxidized via oxygen vacancy insertion or extraction, respectively. In the tungsten layers 12, 14 and the substrate 16 are oxygen vacancy electrolyte 19. The oxygen vacancy (or oxygen ion) 19 allows the overall charge of the gate (reservoir) and channel to be neutral by compensating the electronic charge. When electrons are transferred from gate to channel, the same quantity of ionic charge (carried by the vacancies) are also transferred. While tungsten oxide can intercalate several ions, use of the YSZ electrolyte means that this ECRAM cell operates on the basis of oxygen vacancy ions.

As can be seen in FIG. 1A, three Pt current collector layers are grown onto the tungsten oxide layers by sputtering over shadow masks. In this exemplary embodiment, a first current collector is shown grown upon the Gate $WO_{3-x}$ layer and is referred to as the Gate current collector. The Gate current collector applies electrical potential and electronic current to the gate (reservoir) electrode. A second current collector and a third current collector are beneath the Channel $WO_{3-x}$ layer and are which upon the Channel $WO_{3-x}$ layer is grown. The second current collector is referred to as the source current collector that applies potential and collects current to the channel electrode during 'read' operation. The third current collector is the drain that is connected to the channel and is at ground. In such a manner, an applied gate voltage Vg is applied at the gate current collector versus ground (drain electrode) to program (write) the device. Programming the device is setting the composition and phase fraction in the channel state phase of the Channel $WO_3$-x. After programming the ECRAM, the Drain is at ground, 'read' voltage $V_R$ is applied at the source current collector vs Drain (ground) to read the device.

Note that FIG. 1 shows a rectangular dash-lined box that indicates a sampling zone of the device for testing.

In other embodiments, other conductive current collector materials may be used, such as but not limited to Au, Cu and TiN. The channel tungsten layer 14 includes $V_o$ that indicates oxygen vacancy. Also shown in FIG. 1A is an applied gate voltage $V_G$ that indicates voltage applied to the gate (reservoir) and a downward arrow that indicates direction of vacancy transport. During 'write' both Drain and Source can be at ground. After 'write', during 'read', Drain is at ground and a small potential, typically 100 mV is applied to the Source. In such a manner, this device is similar to a MOSFET, device is like a MOSFET: $V_G$ is applied versus ground to program (write) the devices. Drain is at ground, source is applied vs ground to read the device. $V_R$ may be for reservoir.

In an embodiment, a passivation layer of hafnium oxide ($HfO_2$) or other barrier oxide is grown upon the $WO_{3-x}$ to reduce the oxidation of $WO_{3-x}$ by the environment. The passivation layer is grown over the entire chip except for the pads to connect to the array of devices. Except for the YSZ substrate, all processes are back end of the line (BEOL) compatible, with growth below 200° C. Energy dispersive spectroscopy of this tungsten sub-oxide suggests a metal to oxygen ratio of 2:5, yielding $WO_{3-x}$ where X=0.5. This device was operated by applying a positive gate voltage $V_G$ to potentiate or a negative gate voltage to depress; during retention, a 0V was used to ground the gate, short-circuiting it to the channel. Because a selector or a switch with finite leakage in series with the gate is not used, as done in past devices, the ability to retain state under short circuit can be scaled to smaller devices.

Figure 1B:
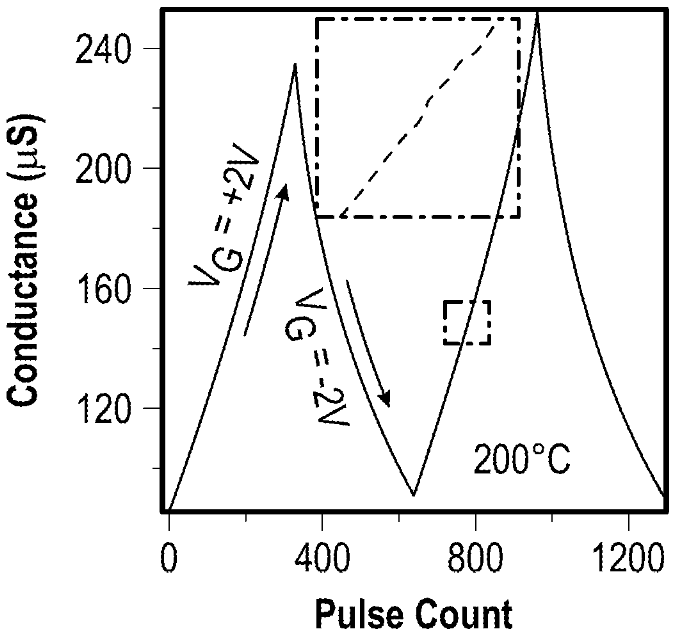
FIG. 1B shows linear and symmetric switching among many analog states for the ECRAM cell of FIG. 1A. Each pulse applies a voltage of +/−2 V for 30 seconds.
Figure 1C:
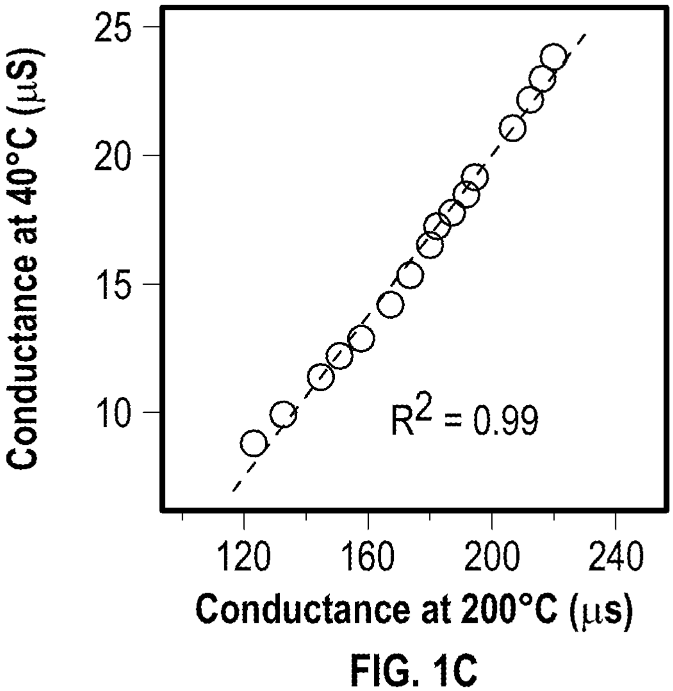
FIG. 1C shows a direct linear mapping of the conductance at 200° C. and the conductance at 40° C.

Like other ECRAM cells, this device possesses linear and symmetric analog switching, with at least 200 distinct analog states. FIG. 1B shows linear and symmetric switching among many analog states for the ECRAM cell of FIG. 1A. Each pulse applies a voltage of +/−2 V for 30 seconds. The write current density of 10-14 A/μm$^2$ is comparable with other ECRAM cells, and much lower than that of phase-change, ReRAM, and floating gate memory. The channel conductance, at ~100 μS, is generally higher than optimal for in-memory computing. However, the channel conductance drops by about an order of magnitude between 200° C. to 40° C. as shown in FIG. 1C. As a result, while the conductance state should be set at high temperatures, inference could be conducted at near-room temperatures with much lower electronic conductances and consequently improved power efficiencies. Further decrease of the conductance by at least one order of magnitude can be achieved by simply reducing the width-to-length ratio from 16:1 to 1:1 and would place this cell well within the target of ~1 MΩ for analog inference. The switching time and temperature can be decreased by reducing the YSZ thickness from ~300 μm to <1000 nm.

Demonstration of Nonvolatile ECRAM

Figure 2A:
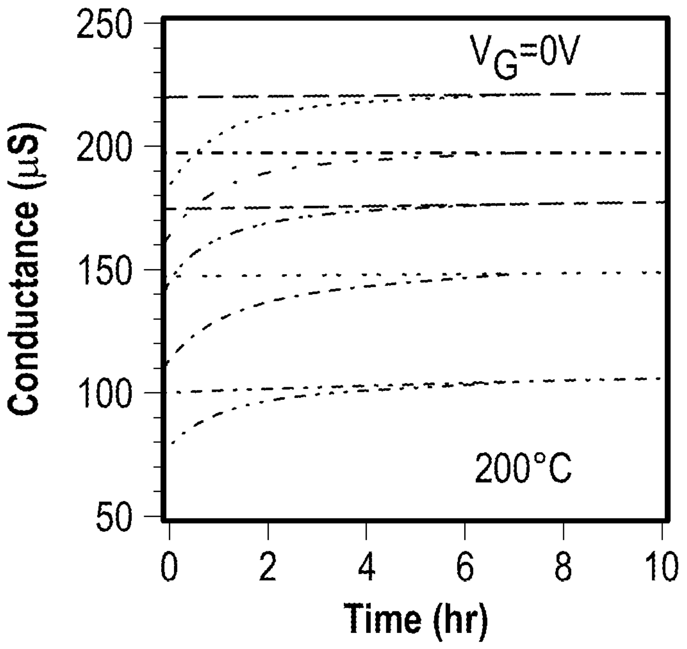
FIG. 2A shows ECRAM retention characteristics when the gate and channel are shorted after setting to a given state, our ECRAM cells will stabilize into one of several different analog resistance states. Dashed lines are tangent line constructions that project different conductance values as a function of time.

Having shown that any resistance state within the range can be switched by applying a gate voltage for a given amount of time (see FIG. 1B), the retention behavior under short circuit was next investigated. In FIG. 2A, we monitor the channel conductance when $V_G$-0V after the device is set to different resistance states. To our surprise, while there exists a volatile transient response, the conductance states ultimately settle at different values, and not to a global equilibrium value. A tangent line extrapolation over the last 300 seconds confirms that the channel conductances are not converging. While we only show five analog states due to experimental time constraints, it is anticipated that each switched state in FIG. 1B yields a distinct retention profile and a different final conductance. Whereas applying a gate voltage of 0V without a switch to other ECRAM erases the previously programming resistance state, this ECRAM cell shows that a non-volatile change in resistance can be achieved even under short circuit at elevated temperatures.

Figure 2B:
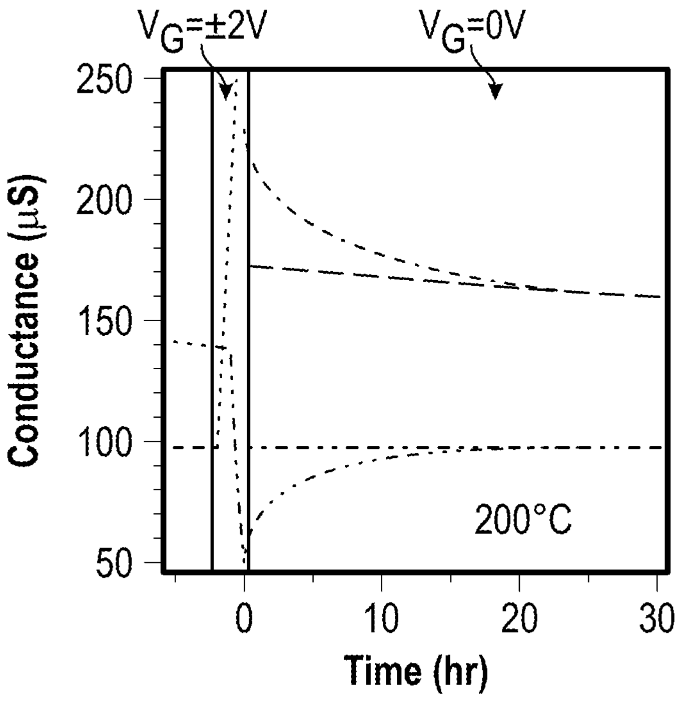
FIG. 2B shows ECRAM retention characteristics when the gate and channel are shorted as retention times held for 24 hours from the low-resistance and high-resistance states. t=0 hr signify when retention measurements start, which occur after a 1 or 2 hr switching at VG=+2V. The tangents lines to these retention profiles converges after about 150 hours at 200° C.

In FIG. 2B, non-volatility over 24 hours at 200° C. was monitored from the high resistance and the low resistance state with $V_G$-0V. Once again, a volatile transient response and a nonvolatile response was observed. Interestingly, while the conductance of the high-resistance state is very stable, there is a slight decrease in the conductance of the low-resistance state over time. It is hypothesized that this is a result of slow atmospheric oxidation of the suboxides, despite the $HfO_2$ protection layer. However, even a tangent line extrapolation suggests that the high- and low-resistance states will not converge until at least 150 hours at 200° C. It is noted that the slopes of these tangent lines decrease over time and approach 0. If the tangent line reaches 0, the conductance values will not converge, and the projected retention approaches infinity. In the absence of atmospheric oxidation, we anticipate that the tangent line slope will eventually reach 0, and that the cell will exhibit a permanent change in the channel conductance.

Figure 2C:
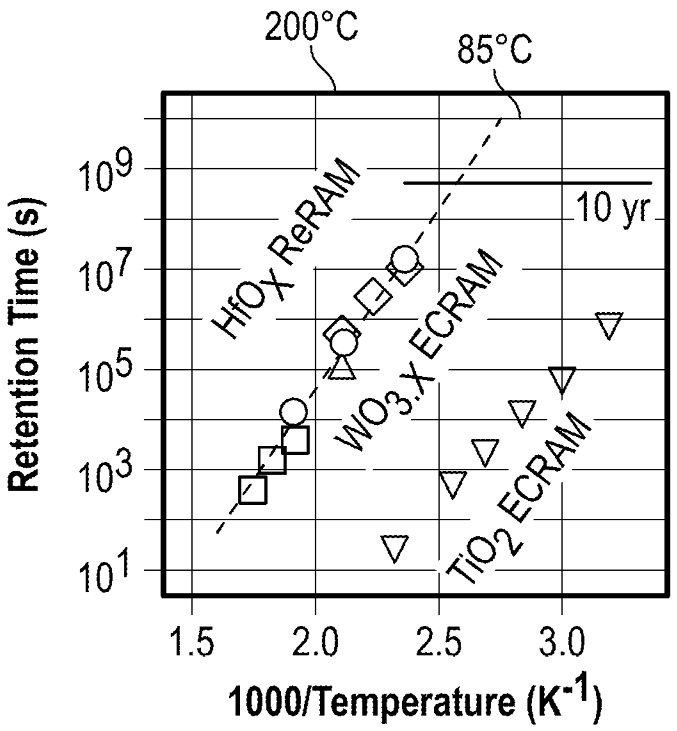
FIG. 2C shows a comparison of retention times of $WO_{3-x}$ ECRAM with filament-based ReRAM and past TiO2-based ECRAM. Each different marker shape for $HfO_X$ ReRAM indicates results from a different paper. The two $WO_3$-x-ECRAM retention times at 24 (triangle) and 150 (diamond) hours equals the time for the experiment in FIG. 2B and the extrapolated tangent line convergence. Both values likely underestimate the retention.

The retention time of the disclosed $WO_X$-ECRAM was compared with that of other ECRAM cells and with two-terminal filamentary ReRAM based on $HfO_X$ (FIG. 2C). The disclosed cell retention times are about 3-4 orders of magnitude higher than anatase TiO2-based ECRAM cells using a similar single-crystal YSZ electrolyte substrate. More excitingly, the disclosed cell achieved retention time of 24 hours and tangent-line extrapolated result of >150 hours at 200° C. are comparable to that of $HfO_X$-based two-terminal ReRAM devices at the same temperature. It is well accepted that such $HfO_X$-based ReRAM devices yield 10 years of retention time at 85° C.

The retention time was then projected to lower temperatures. In the disclosed device, the low-resistance and high-resistance states do not converge in 24 hours at 200° C. and may never actually converge. Thus, it is not possible to directly extrapolate the retention time by measuring when the high- and low-resistance states converge at different temperatures. Instead, the gate electrochemical current IG is treated as proportional to the ionic conductivity of the YSZ electrolyte. It has been confirmed that this gate current I has an Arrenhius relationship with an activation energy equal to 1.2 eV. In the next section, it is shown how the channel conductance is controlled by the integral of the gate current IG, or the gate charge Q. As a result, if the ionic conductivity and resulting gate current decreases by a factor of 10, then it is expected that it will take 10 times longer to yield a certain gate charge Q, and the retention time will be 10 times higher. Because the ionic resistivity of YSZ has an activation energy of 1.1-1.2 eV, it is expected that the gate current at 85° C. will be about 6,000-13,000 times lower than that at 200° C. This yields an expected retention time from 24 hours at 200° C. to 15-35 years at 85° C. This is expected to be a lower bound, as this only represents an extrapolation for our 24-hr experiment at 200° C.

To better understand the mechanism for nonvolatile ECRAM, the gate electrochemical current was monitored during the switching and retention process in ECRAM cells containing an electrolyte that conducts ions but blocks electrons, thus ionic current through the electrolyte must equal the electronic current passed between gate and channel (via the external programming circuit) I due to charge balance. This current IG is proportional to the time derivative of X1, defined as the concentration of oxygen vacancy ions in the channel $$\left(I_G \sim \frac{dX_1}{dt}\right)$$

Similarly, the electrochemical charge $$Q(Q(t) = \int I_G(t)dt)$$

describes the net change in the concentration of ions (ΔΔXX1) in the channel over time.

Figure 3A:
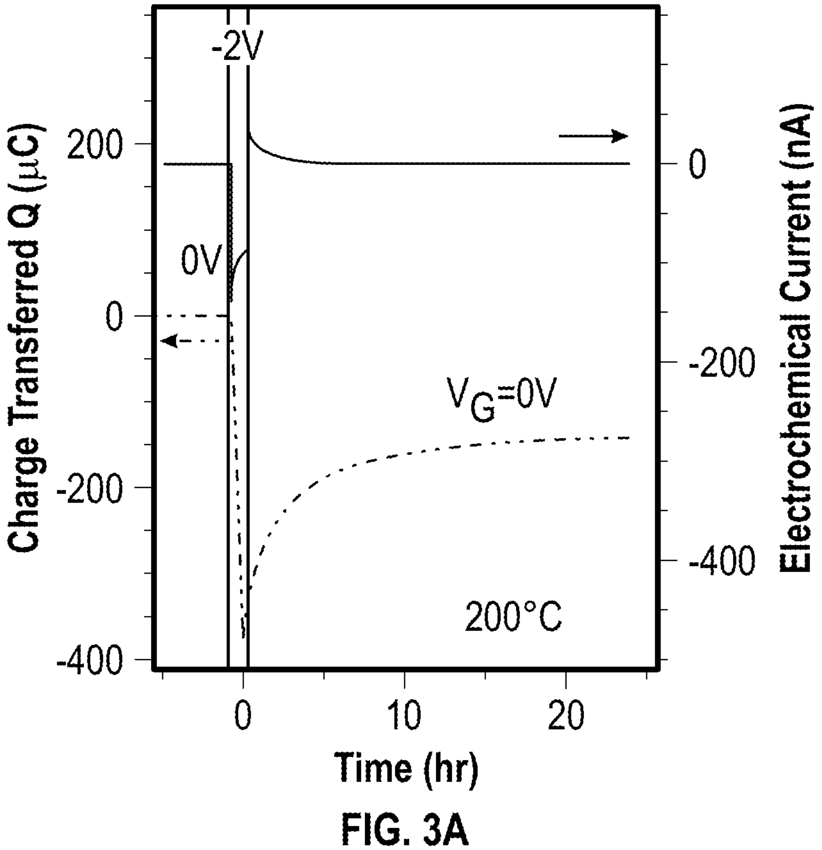
FIG. 3A shows the gate electrochemical charge and currents during switching and retention when the gate current is negative when-2V is applied, and rebounds during retention. However, the net charge transferred Q converges to −140 μC even after 24 hours, suggesting a permanent change in the ion concentration of the channel.

In FIG. 3A, the current IG and charge Q was monitored during a 1 hour depression (−2V) followed by a 24 hour retention (0V), during the same experiment as in FIG. 2B. During depression, $I_G$<0 implies that oxygen vacancies move out of the channel, decreasing the channel conductance (FIG. 2B). However, upon applying 0V, the electrochemical current $I_G$ reverses ($I_G>0$), suggesting that the oxygen vacancies now enter the channel, and are responsible for the transient increase in the channel conductance (FIG. 2B). This electrochemical current rapidly decreases and approaches 0. However, even after 24 hours, Q does not revert to 0. Since ($Q\sim\Delta X_1$)<0, the oxygen vacancy concentration at the end of the 24 hours is lower than the oxygen vacancy concentration before the depression, a result consistent with the nonvolatile decrease in the channel conductance G (FIG. 2B). Furthermore, the electrochemical current $I_G$ has fallen to such a low value that it is unlikely that Q will reach 0. This strongly suggests that the cell has reached a new, permanent change in the ion concentration (X1), just as it reached a different value for G in FIG. 2B.

Figure 3B:
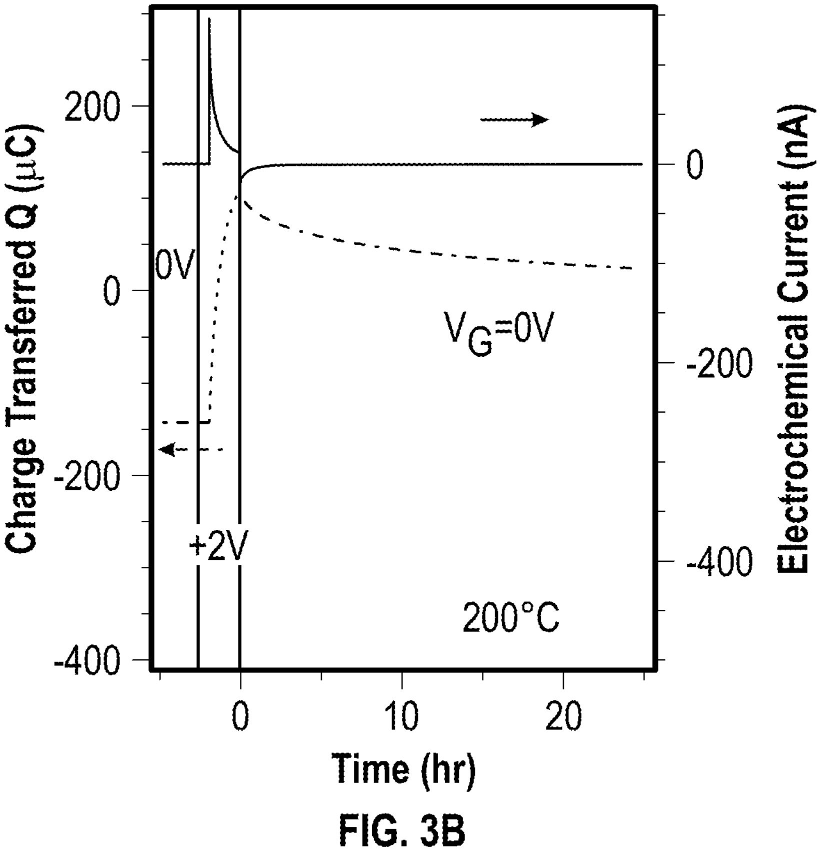
FIG. 3B shows the gate electrochemical charge and currents during switching and retention when a +2V potentiation is applied after the measurements in FIG. 3A. Once again, the net charge transferred after 24 hours once again appears to converge to a different value, suggesting another permanent change in the channel ion concentration despite the 24 hour retention measurement at short circuit.
Figure 3C:
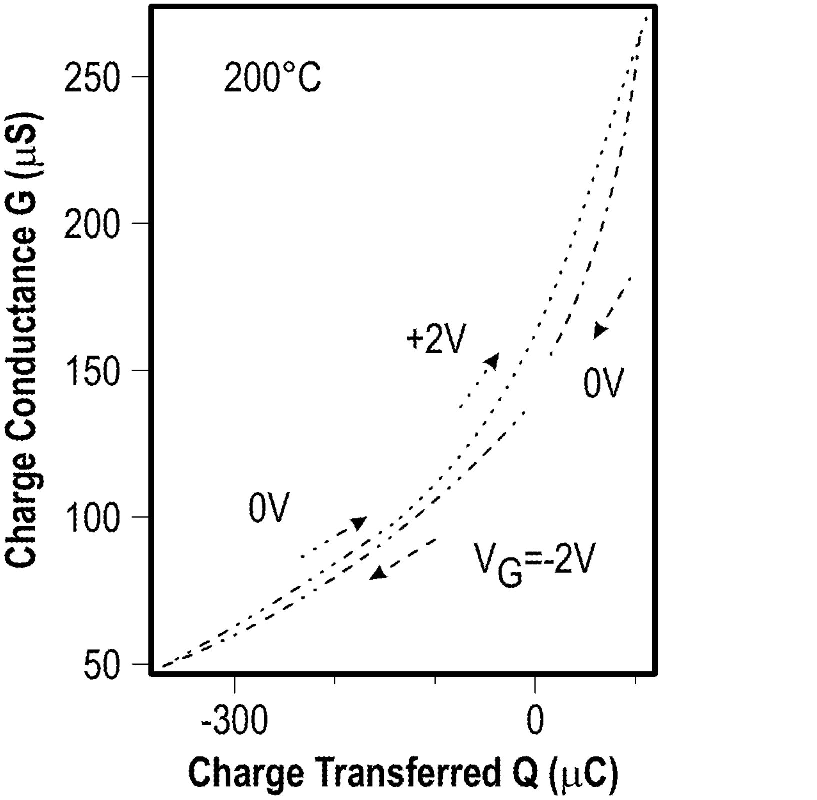
FIG. 3C shows the gate electrochemical charge and currents during switching and retention when the electrochemical charge transferred Q directly maps to the channel conductance G; this is consistent with the permanent changes in both Q and G that indicate nonvolatile state retention.

In FIG. 3B, it is shown that the same behavior during a 2 hour potentiation at $V_G$=+2V followed by a 24 hour retention at 0V, taken immediately after the result in FIG. 3A. The channel conductance during the measurement was plotted in FIG. 2B. We start Q at −140 μC, continuing from the end of the depression-hold in FIG. 3A. In this case, +2V yields a positive current while the following 0V retention yields a negative current. As in the case for the depression in FIG. 3B, the total integrated charge Q during the hold is much lower than that of the potentiation, even as the current is essentially 0. This result is again consistent with nonvolatility observed in FIG. 2B after potentiation. In FIG. 3C, it was confirmed that the conductance of the channel G is effectively only a function of the integrated gate electrochemical charge Q, and nearly independent of other variables. Thus, a change in Q is directly linked to a change in G.

As shown above, analysis of the electrochemical current on the gate shows that holding the cell at 0V for 24 hours fails to recover the Q that was applied during the previous potentiation and depression. This provides additional evidence that the change in the channel conductance shown in FIGS. 2A-C results from a non-volatile change in the oxygen vacancy concentration X1 of the channel.

Phase Separation as the Origin of Nonvolatility in ECRAM

Figure 4A:
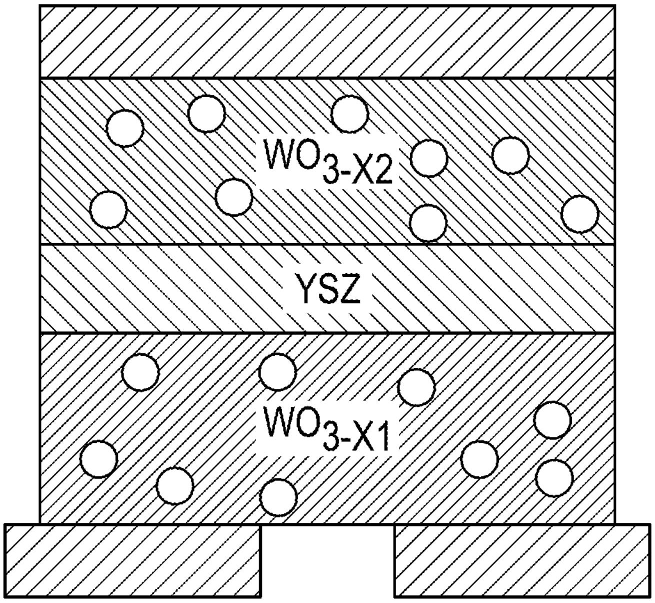
FIG. 4A shows phase separation as a proposed mechanism for the permanent change in channel ion concentration and electronic conductance. Two states (a-b, FIG. 4A and FIG. 4B) are schematically illustrated indicating the state of the ECRAM cell. X1 and X2 represent the concentration of ions in the channel and gate, respectively. (a) State 1 occurs when X1≠X2 and represents the initial state of the cell that uses the same material for the gate and the channel.
Figure 4B:
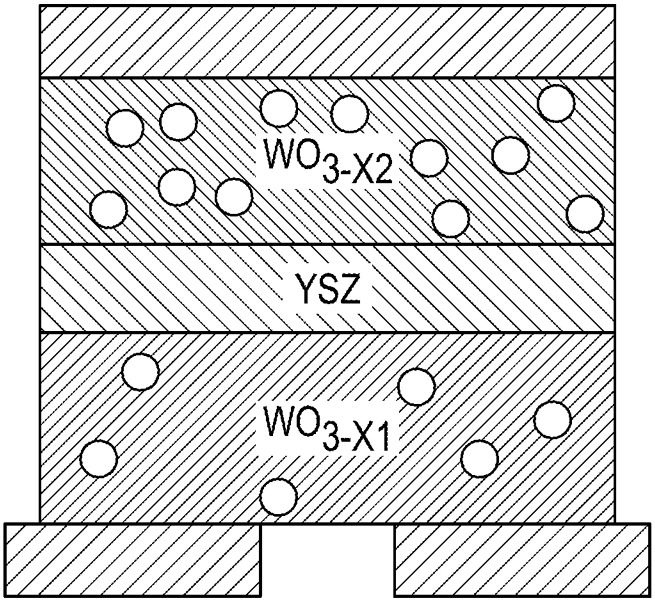
FIG. 4B shows phase separation as a proposed mechanism for the permanent change in channel ion concentration and electronic conductance. Two states (a-b, FIG. 4A and FIG. 4B) are schematically illustrated indicating the state of the ECRAM cell. X1 and X2 represent the concentration of ions in the channel and gate, respectively. State 2 is the general case where X1≠X2 and arises after switching.

Having demonstrated that a nonvolatile change in the channel conductance G and the ion concentration X1 under short circuit, the next section shows how this nonvolatile ECRAM differs from previously demonstrated ECRAM, which are all volatile in comparison, and most require an electrochemical switch to show any retention beyond a few seconds. In this section, a possible mechanism is proposed for how the nonvolatile ECRAM in this work differ from past volatile ECRAM. In FIGS. 4A and 4B, ECRAM cells are schematically illustrated in two states. FIG. 4A shows a state where the channel ion concentration X1 equals the gate ion concentration X2. FIG. 4B shows a state where X1≠X2. The underlying mechanism for all ECRAM devices is that, by applying an electrochemical voltage pulse, the cell can be switched from state 1 to state 2, as well as to a number of other analog resistance states.

Volatile ECRAM Based on Solid Solution

In previously demonstrated types of ECRAM, it is believed that there is only one equilibrium state. This usually occurs when $X_1=X_2$ (FIG. 4A). When the gate and channel are shorted, the ECRAM cell will revert to this equilibrium state. It is proposed herein that ECRAM cells that require a switch should be considered volatile ECRAM because, under equilibrium, they will all revert back to a single resistance state in FIG. 4A. One way to rationalize the relaxation of state 2 to state 1 under short circuit is to consider this a diffusion dominated process where ions migrate from high to low concentrations. Equilibrium is only achieved when $X_1=X_2$, yielding a single equilibrium analog state, and is consistent with drift-diffusion modeling.

Figure 4C:
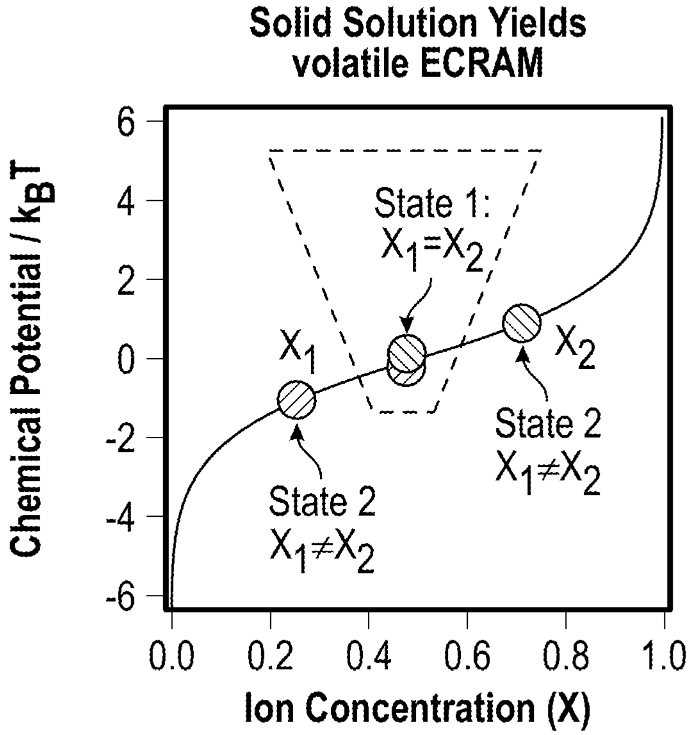
FIG. 4C shows phase separation as a proposed mechanism for the permanent change in channel ion concentration and electronic conductance. If the guest ion chemical potential increases monotonically with the ion concentration, then only state 1 is in equilibrium, and state 2 will eventually revert back to state over time. This yields volatile ECRAM.

A more generalizable framework is to recognize that the mass flux follows the spatial gradient of the ion's chemical potential u, rather than the gradient of the ion concentration X. Equilibrium is attained when the ion chemical potential in the channel $\mu(X_1)$ equals that of the gate $\mu(X_2)$. When the chemical potential $\mu(X)$ increases monotonically with X (FIG. 4C), which is the case for when the ion forms a solid solution with the host, this equilibrium condition $\mu(X_1)=\mu(X_2)$ is only attained when $X_1=X_2$. This results in volatile ECRAM with only a single equilibrium state. It is noted that the exact shape of $\mu(X)$ does not necessarily need to equal that FIG. 4C; rather, it only needs to monotonically increase (or decrease) with the ion concentration X.

Nonvolatile ECRAM Based on Phase Separation

Figure 4D:
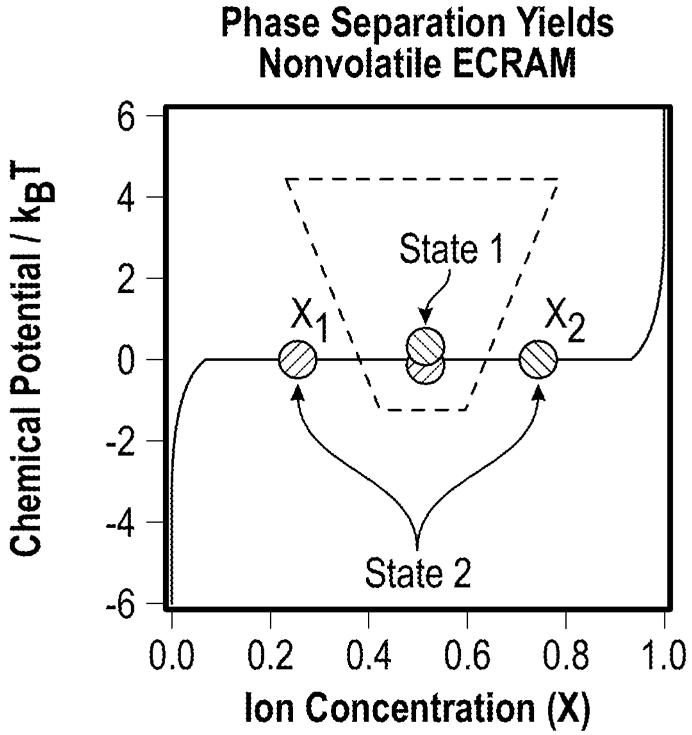
FIG. 4D shows phase separation as a proposed mechanism for the permanent change in channel ion concentration and electronic conductance. If there exists a plateau in the chemical potential, then both state 1 and 2 are stable, meaning that a permanent change in X2, which can yield the nonvolatile state retention observed in this work. This case arises when the channel material separates into two or more phases. We note that, from a thermodynamic perspective, that there ultimately is only one equilibrium configuration even in two-phase systems due to interfacial energy; however, the driving force to equilibrate interfaces is very small, and will take much longer to equilibrate interfaces than to equilibrate compositional differences in a solid solution.

As discussed in the previous paragraph, the thermodynamic equilibrium condition is that $\mu(X_1)=\mu(X_2)$. If this condition can be achieved when $X_1+X_2$, such as through the chemical potential profile shown in FIG. 4D, then the switched state B (FIG. 4B) is also in equilibrium and will not revert to state A. In fact, there are likely a very large, possibly continuous, number of analog equilibrium or near-equilibrium states. The flat chemical potential profile shown in FIG. 4D is commonly seen in phase-separating materials systems, where the common tangent construction of the Gibbs free energy yield phase separation. Such phase-separating systems cannot be modeled using drift-diffusion type equations because ions do not necessarily move from high to low concentrations. While phase separation is difficult to probe in amorphous materials like our $WO_X$ channel, our result nonetheless suggests that phase separation is a strong candidate for the origin of nonvolatility (see FIGS. 3A-C and FIGS. 4A-D). It is well documented in other electrochemical systems like Li-ion batteries that phase separation is responsible for the simultaneous coexistence of ion-rich and ion-poor regions; similarly, in nonvolatile ECRAM, phase separation can yield a gate and a channel with different ion concentrations ($X_1/X_2$) that will not revert to $X_1=X_2$.

Within this framework, experimental results above show both a transient response and a nonvolatile response. In FIG. 2B and FIG. 3B, the channel conductance G and the gate charge Q decrease during depression but increases during the 24 hour retention. However, this transient increase ($\Delta Q$=+200 μC) is substantially less than the original decrease ($\Delta Q$=−380 μC), and both Q and G ultimately settle to a state different from the initial Q and G. This is consistent with state 2 in that FIG. 4B represents a different resistance than state 1 in FIG. 4A; however, in this case, both states are considered equilibrium configurations. It is believed that the steady-state, nonvolatile response is a result of phase separation, as $\mu(X_1)=\mu(X_2)$, both at the start and at the end of the measurement. The origin of the long transient response is not clear; some possibilities include the volatile response of an electrochemical double-layer or the nucleation time for phase separation.

Finally, it is noted that FIG. 4D does not consider the requirement to minimize interfaces in spinodal decomposition. In this respect, there may only be one final, ultimate equilibrium configuration. However, to reach this final state, which may not be state 1 ($X_1=X_2$), it will take much longer than the timescales based on Fickian diffusion and may not be reachable in experimental timescales. This process may be analogous to coarsening, which slows over time. Moreover, it is unclear how these "coarsening" process will affect the measured electronic resistance, making it very difficult to understand the dynamics of reaching this final equilibrium state.

DISCUSSION

Nonvolatile behavior and projected permanent changes in G are paradigm changing for ECRAM and nonvolatile memory, especially considering the poor retention of previous reports at scale. An ECRAM cell with multiple nonvolatile resistance states under short circuit is compelling for robust inference engines that operate throughout the lifetime of a product. The retention of such cells is orders of magnitude higher than past ECRAM research and is comparable to that of $HfO_X$-based ReRAM at 200° C. (FIG. 2C). Moreover, it is shown herein that trying to find phase separating materials is the key to achieving ECRAM cells with excellent retention times. This results shows that applications for ECRAM extend beyond on-line training, as suggested in past works. Inference is not only more broadly applicable, but also one where requirements like switching time, temperature, and endurance are less stringent.

While the nonvolatile $WO_X$-ECRAM is highly promising, there are several materials challenges that must be resolved. Creating a thin-film device is not only more practical for CMOS integration, but also substantially reduces the switching and settling times. Because the changes in the conductance states can be permanent due to phase separation (FIG. 4D), these thin-film devices also have excellent state retention, even if the ionic currents are higher due to thinner electrolytes.

Method Section

Fabrication of $WO_{3-x}$ ECRAM Cells

300-μm-thick, 1 cm square, single-crystal yttrium-stabilized zirconia (8 mol % $Y_2O_3$ in $ZRO_2$ substrates were used without further cleaning or treatment. 50 nm of WO3-X was sputtered on the gate side through an 8 mm square shadow mask. The target was a 3-inch W target of 99.95% purity. The target power was 100 W. To make the sub-oxide, the sputter gas was a mixture of $Ar:O_2$ at a ratio of 85:15, controlled by mass flow controllers. The sputter gas pressure was 3 mtorr. The substrate to target distance was about 15 cm.

The 18-nm-thick gate Pt current collector was sputtered on top of the WO3-X layer using the same shadow mask without breaking vacuum. The target was a 2-inch Pt target; the sputter gas was 3 mtorr of pure argon. After growing both the suboxide and metal layers, we flip the substrate and grow the same WO3-X on the channel side with the same shadow mask. Finally, the two Pt current collectors on the channel with a different shadow mask. This mask has two square regions separated by 0.5 mm. All shadow masks were made from a 0.13 mm thick stainless steel sheet. All sputtering was done at room temperature; no additional annealing was conducted.

Finally, to protect the cell from environmental oxidation, atomic layer deposition was used to grow 35 nm of $HfO_X$ on the channel side of the ECRAM device. A thermal deposition was done at 200° C., using the precursor TDMAH and Argon gas, and ran for 297 cycles, at a rate of ~1 Å/cycle and 24 seconds per cycle. The film thickness was measured to be ~35 nm (FIG. 1A). While the $HfO_X$ passivation layer reduced environmental oxidation, it did not fully eliminate oxidation at these elevated temperatures, as seen in the long retention measurements FIGS. 2A-C.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth.

Although the foregoing embodiments have been described in some detail for purposes of clarity of understanding, it will be apparent that certain changes and modifications may be practiced within the scope of the specification. It should be noted that there are many alternative ways of implementing the processes, systems, and apparatus of the present embodiments. Accordingly, the present embodiments are to be considered as illustrative and not restrictive, and the embodiments are

What is claimed is:

1. An ECRAM device, comprising:

a solid electrolyte having a first side and a second side;

a Gate layer of a metal sub-oxide on the first side, the Gate layer having a Gate layer first side in contact with the first side of the solid electrolyte, and a Gate layer second side opposite the Gate layer first side;

a Channel layer of the metal sub-oxide on the second side, the Channel layer having a Channel layer first side in contact with the second side of the solid electrolyte, and a Channel layer second side opposite the Channel layer first side;

a first current collector electrically connected to the Gate layer second side;

a second current collector electrically connected the Channel layer second side; and a third current collector electrically connected to the Channel layer second side;

wherein an ion chemical potential in the Channel layer ($\mu(X_1)$) equals an ion chemical potential in the Gate layer ($\mu(X_2)$) to provide a phase separation of the sub-oxide in the Channel layer; and wherein the solid electrolyte is an ionic conductor of oxygen vacancies and an electronic insulator.

2. The device of claim 1, wherein the solid electrolyte is formed of a material selected from a group consisting of yttrium stabilized zirconia and $HfO_X$.

3. The device of claim 1, wherein the solid electrolyte is between 10 nm and 1000 nm thick.

4. The device of claim 1, wherein the Gate and Channel layers are between 10 nm and 1000 nm thick.

5. The device of claim 1, wherein the metal sub-oxide is a sub-oxide of a metal selected from a group consisting of tungsten, tantalum, nickel, cobalt and vanadium.

6. The device of claim 1, further comprising a passivation layer, grown upon the Gate and Channel layers, to reduce the oxidation of Gate and Channel layers by the environment.

7. A method of forming an ECRAM cell, comprising:

depositing a second and third current collector onto a substrate;

depositing a Channel layer of a metal sub-oxide upon the second and third current collector;

depositing a solid electrolyte upon the Channel layer;

depositing a Gate layer upon the solid electrolyte; and depositing a first current collector upon the Gate layer;

wherein an ion chemical potential in the Channel layer ($\mu(X_1)$) equals an ion chemical potential in the Gate layer ($\mu(X_2)$) to provide a phase separation of the sub-oxide in the Channel layer; and wherein the solid electrolyte is an ionic conductor of oxygen vacancies and an electronic insulator.

8. The method of claim 7, wherein the solid electrolyte is formed of a material selected from a group consisting of yttrium stabilized zirconia and $HfO_X$.

9. The method of claim 7, wherein the solid electrolyte is between 20 nm and 1000 nm thick.

10. The method of claim 7, wherein the Gate and Channel layers are between 10 nm and 1000 nm thick.

11. The method of claim 7, wherein the metal sub-oxide is a sub-oxide of a metal selected from a group consisting of tungsten, tantalum, nickel, cobalt and vanadium.

12. The device of claim 7, further comprising:
depositing a passivation layer upon the Gate and Channel layers to reduce the oxidation of Gate and Channel layers by the environment.

13. A method of operating an ECRAM cell, comprising:
providing an ECRAM cell comprising:
a solid electrolyte having a first side and a second side;
a Gate layer of a metal sub-oxide disposed on the first side of the solid electrolyte, the Gate layer having a Gate layer first side in contact with the solid electrolyte and a Gate layer second side opposite the Gate layer first side;
a Channel layer of the metal sub-oxide disposed on the second side of the solid electrolyte, the Channel layer having a Channel layer first side in contact with the second side of the solid electrolyte and a Channel layer second side opposite the Channel layer first side;
a first current collector electrically connected to the Gate layer second side;
a second current collector electrically connected the Channel layer second side; and
a third current collector electrically connected to the Channel layer second side;
applying a voltage across the ECRAM cell to set the state of the Channel layer;
applying a voltage of 100 mV to the second current collector; applying ground to the third current collector; and reading the Channel layer current between the second and third current collectors to determine the state of the Channel layer;
wherein the ECRAM cell configuration provides phase separation in the channel layer; wherein an ion chemical potential in the Channel layer ($\mu(X_1)$) equals an ion chemical potential in the Gate layer ($\mu(X_2)$) to provide the phase separation of the sub-oxide in the Channel layer; and wherein the solid electrolyte is an ionic conductor of oxygen vacancies and an electronic insulator.

* * * * *